(12) United States Patent
Shirahata et al.

(10) Patent No.: US 6,872,628 B2
(45) Date of Patent: Mar. 29, 2005

(54) METHOD OF MANUFACTURING SEMICONDUCTOR DEVICE

(75) Inventors: Masayoshi Shirahata, Tokyo (JP); Yukio Nishida, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 294 days.

(21) Appl. No.: 10/245,353

(22) Filed: Sep. 18, 2002

(65) Prior Publication Data

US 2003/0100173 A1 May 29, 2003

(30) Foreign Application Priority Data

Nov. 28, 2001 (JP) .................................. P2001-362045

(51) Int. Cl.⁷ ............................................ H01L 21/336
(52) U.S. Cl. .................... 438/305; 438/306; 438/232; 438/525; 438/527; 438/914; 438/961
(58) Field of Search ................................ 438/231, 232, 438/305, 306, 525, 527, 914, 961, FOR 188

(56) References Cited

U.S. PATENT DOCUMENTS

| | | | |
|---|---|---|---|
| 5,668,024 A | | 9/1997 | Tsai et al. |
| 5,759,901 A | * | 6/1998 | Loh et al. .................... 438/305 |
| 5,793,090 A | | 8/1998 | Gardner et al. |
| 5,824,586 A | * | 10/1998 | Wollesen et al. ........... 438/300 |
| 5,851,893 A | * | 12/1998 | Gardner et al. ............. 438/305 |
| 5,869,879 A | * | 2/1999 | Fulford et al. .............. 257/510 |
| 5,895,955 A | * | 4/1999 | Gardner et al. ............. 257/336 |
| 6,037,230 A | * | 3/2000 | Holloway ................... 438/289 |
| 6,107,130 A | * | 8/2000 | Fulford et al. .............. 438/231 |
| 6,157,062 A | * | 12/2000 | Vasanth et al. ............. 257/336 |
| 6,232,166 B1 | * | 5/2001 | Ju et al. ...................... 438/231 |
| 6,576,965 B2 | * | 6/2003 | Eikyu et al. ................ 257/408 |
| 2001/0018255 A1 | * | 8/2001 | Kim et al. ................... 438/305 |
| 2002/0050614 A1 | * | 5/2002 | Unnikrishnan .............. 257/347 |
| 2002/0127791 A1 | * | 9/2002 | Nanjo et al. ................ 438/231 |

FOREIGN PATENT DOCUMENTS

| | | |
|---|---|---|
| JP | 5-36719 | 2/1993 |
| JP | 7-147396 | 6/1995 |
| JP | 7-297393 | 11/1995 |
| JP | 11-177083 | 7/1999 |

OTHER PUBLICATIONS

Masaaki Kinugawa, et al., "Submicron MLDD NMOSFETS for 5V Operation", Semiconductor Device Engineering Laboratory, Toshiba Corporation, VLSI Tech. Sympo. '85, pp. 116–117.

* cited by examiner

*Primary Examiner*—George Fourson
*Assistant Examiner*—Joannie Adelle Garcia
(74) *Attorney, Agent, or Firm*—Oblon, Spivak, McClelland, Maier & Neustadt, P.C.

(57) ABSTRACT

A gate structure (4), an LDD region (6) and a sidewall (7) are provided in this order. Arsenic ions (8) are thereafter implanted into the upper surface of a silicon substrate (1) by tilted implantation. The next step is annealing for forming an MDD region (9) in the upper surface of the silicon substrate (1). The MDD region (9) and the gate structure (4) do not overlap one another in plan view. Further, the MDD region (9) formed into a depth shallower than that of the LDD region (6) is higher in concentration than the LDD region (6). Thereafter a source/drain region (11) higher in concentration than the MDD region (9) is provided by vertical implantation into a depth greater than that of the LDD region (6).

15 Claims, 8 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device and more particularly, to a method of manufacturing an MOSFET allowing compensation for degradation of its lifetime caused by hot carriers.

2. Description of the Background Art

In the field of LSI, there has been a growing trend towards microstructure and high degree of integration of an element, thereby allowing reduction in manufacturing cost and increase in operating speed. On the other hand, microstructure of the element will induce high electric field within a semiconductor substrate, causing degradation of characteristic of the element resulting from hot carriers. More particularly, carriers are accelerated by high electric field near drain to have high energy, pass over an energy barrier between the semiconductor substrate and a gate insulating film and get into the gate insulating film. As a result, there arises fluctuation in threshold voltage Vth of an MOSFET. In the present specification and claims, degradation of the element characteristic thereby caused is called as "lifetime degradation caused by Vth shift". The lifetime degradation caused by Vth shift can be compensated for by relaxing high electric field near the drain. For relaxation of high electric field near the drain, an LDD (lightly doped drain) structure has been widely adopted.

FIGS. 15 through 18 are sectional views illustrating a method of manufacturing a semiconductor device having an LDD structure in the background art following the sequence of its steps. First, with reference to FIG. 15, a p-type silicon substrate 101 is prepared. A silicon oxide film is thereafter provided on the entire upper surface of the silicon substrate 101 by thermal oxidation. Next, a polysilicon film is provided on the entire surface of the silicon oxide film by CVD. The silicon oxide film and the polysilicon film are then patterned using photolithography and anisotropic dry etching, thereby forming a gate structure 104 including a gate insulating film 102 and a gate electrode 103.

With reference to FIG. 16, the subsequent step is ion implantation implanting phosphorous ions 105 into the upper surface of the silicon substrate 101 under the conditions of 25 keV and 5E13 $cm^{-2}$. At this time, the gate structure 104 serves as a mask against ion implantation. Thereafter annealing is performed for about 30 seconds at a temperature of 900° C., inducing thermal diffusion of the implanted phosphorous ions 105 in the silicon substrate 101. LDD regions 106 forming a pair are thereby provided in the upper surface of the silicon substrate 101.

Next, with reference to FIG. 17, using CVD, a silicon nitride film is entirely provided on the structure gained in FIG. 16. This silicon nitride film is thereafter etched by anisotropic dry etching, thereby forming sidewalls 107 on the side surfaces of the gate structure 104.

With reference to FIG. 18, the subsequent step is ion implantation implanting arsenic ions 108 into the upper surface of the silicon substrate 101 under the conditions of 60 keV and 5E15 $cm^{-2}$. At this time, the gate structure 104 and the sidewalls 107 each serve as a mask against ion implantation. Thereafter annealing is performed for about 30 seconds at a temperature of 1000° C., inducing thermal diffusion of the implanted arsenic ions 108 in the silicon substrate 101. Source/drain regions 109 forming a pair are thereby provided in the upper surface of the silicon substrate 101.

According to the semiconductor device manufactured by the background-art method, the LDD regions 106 of relatively low concentration extend under the sidewalls 107 as illustrated in FIG. 18. Due to this, depletion layer of the source/drain regions 109 extends as far as the regions defined under the sidewalls 107. As a result, the high electric field near the drain can be relaxed, thereby allowing compensation for degradation of lifetime caused by Vth shift.

As described above, the existence of the LDD regions 106 results in compensation for lifetime degradation caused by Vth shift. On the other hand, hot carriers getting into the lower parts of the sidewalls 107 from the LDD regions 106 may be another cause of degradation of element characteristic. More particularly, by repulsive force of carriers accumulated in the lower part of each sidewall 107 (corresponding to electrons when the device is an NMOSFET), carriers (electrons) near the upper surface of each LDD region 106 are pressed in a depth direction of the silicon substrate 101. The concentration of carriers in the vicinity of the upper surface of the LDD region 106 is thereby lowered, resulting in increase in parasitic resistance and reduction in drain current. In the present specification and claims, the degradation of the element characteristic thereby caused is called as "lifetime degradation caused by current reduction".

FIG. 19 is a graph showing relation between a width W of the sidewall 107 (see FIG. 17) and hot carrier lifetime. The hot carrier lifetime includes device lifetime defined by Vth shift and lifetime defined by current reduction. It is seen from FIG. 19 that as the sidewall 107 decreases in width W, lifetime K1 defined by current reduction increases. This is because the number of hot carriers getting into the lower part of the sidewall 107 is reduced as the sidewall 107 decreases in width W. On the other hand, it is also seen that as the sidewall 107 increases in width W, lifetime K2 defined by Vth shift increases. This is because degree of relaxation of maximum electric field in the boundary between a channel region under the gate structure 104 and the LDD region 106 increases as the sidewall 107 increases in width W. There is a trade-off between the lifetimes K1 and K2 accordingly, providing a proper range for the sidewall width W within which both the lifetimes K1 and K2 each have a reference value k or more. Namely, according to the illustrative example in FIG. 19, when the sidewall width W is set to have a value falling within a range of W1 to W2, the lifetimes K1 and K2 will each have the reference value k or more.

From a practical design standpoint of the MOSFET, however, sidewall width may be determined in consideration of element characteristics other than the lifetimes K1 and K2. More particularly, in many cases, sidewall width may be set to have a value beyond the foregoing proper range for the purpose of suppressing short channel effect. With reference to FIG. 19, when the sidewall width W is set to be W3 giving a higher priority to short channel characteristic, it is seen that the lifetime K2 exceeds the reference value k yet the lifetime K1 fails to reach the value k.

As described, according to the background-art method of manufacturing a semiconductor device, the sidewall width having a value beyond the proper range has resulted in the problem of degradation of lifetime caused by current reduction.

SUMMARY OF THE INVENTION

It is an object of the present invention to provide a method of manufacturing a semiconductor device allowing compensation for degradation of lifetime caused by current reduction even when the device is provided with a sidewall width having a value beyond a proper range.

According to a first aspect of the present invention, the method of manufacturing a semiconductor device includes the following steps (a) through (c) and (x) through (z). The step (a) prepares a substrate. The step (b) provides a gate structure on a main surface of the substrate. The step (x) implants a first impurity of a predetermined conductivity type into the main surface of the substrate using the gate structure serving as a mask against implantation, thereby forming a first impurity-injected region having a first depth and a first concentration. The step (c), performed after the step (x), provides a sidewall on a side surface of the gate structure. The step (y) implants a second impurity of the predetermined conductivity type into the main surface of the substrate including a region defined under the sidewall using the gate structure and the sidewall each serving as a mask against implantation, thereby forming a second impurity-injected region having a second depth and a second concentration. The second depth is shallower than the first depth and the second concentration is higher than the first concentration. The step (z) implants a third impurity of the predetermined conductivity type into the main surface of the substrate using the gate structure and the sidewall each serving as a mask against implantation, thereby forming a third impurity-injected region having a third depth and a third concentration. The third depth is greater than the first depth and the third concentration is higher than the second concentration. The second impurity-injected region does not overlap the gate structure in plan view in the step (y).

The second impurity-injected region higher than the first impurity-injected region in concentration is provided under the sidewall. Therefore, as compared with a semiconductor having no second impurity-injected region, a contact area between the first impurity-injected region of high electric field and the sidewall is reduced. As a result, the number of hot carriers getting into the lower part of the sidewall from the first impurity-injected region can be reduced, thereby allowing compensation for degradation of lifetime caused by current reduction. Further, the second impurity-injected region shallower in depth than the first impurity-injected region results in suppression of threshold voltage roll-off.

Still further, even after formation of the second impurity-injected region, the upper surface of the first impurity-injected region in part keeps contact with the bottom surface of the sidewall. As a result, it is allowed to avoid concentration of high electric field only under the gate structure.

According to a second aspect of the present invention, the method of manufacturing a semiconductor device includes the following steps (a) through (c) and (x) through (z). The step (a) prepares a substrate. The step (b) provides a gate structure on a main surface of the substrate. The step (x) implants a first impurity of a first conductivity type into the main surface of the substrate using the gate structure serving as a mask against implantation, thereby forming a first impurity-injected region having a first depth and a first concentration. The step (c) provides a first insulating film on a structure obtained by the step (x). The first insulating film has a first portion defined on a side surface of the gate structure. The step (y) implants a second impurity of the first conductivity type into the main surface of the substrate using the gate structure and the first portion each serving as a mask against implantation, thereby forming a second impurity-injected region having a second depth and a second concentration. The second depth is shallower than the first depth and the second concentration is higher than the first concentration. The step (d) provides a second insulating film on a structure obtained by the step (y). The second insulating film has a second portion defined on a side surface of the first portion. The step (e) etches the first and second insulating films, thereby forming a sidewall on a side surface of the gate structure. The step (z) implants a third impurity of the first conductivity type into the main surface of the substrate using the gate structure and the sidewall each serving as a mask against implantation, thereby forming a third impurity-injected region having a third depth and a third concentration. The third depth is greater than the first depth and the third concentration is higher than the second concentration. The second impurity-injected region does not overlap the gate structure in plan view in the step (y).

The second impurity-injected region higher than the first impurity-injected region in concentration is provided under the sidewall. Therefore, as compared with a semiconductor device having no second impurity-injected region, a contact area between the first impurity-injected region of high electric field and the sidewall is reduced. As a result, the number of hot carriers getting into the lower part of the sidewall from the first impurity-injected region can be reduced, thereby allowing compensation for degradation of lifetime caused by current reduction. Further, the second impurity-injected region shallower in depth than the first impurity-injected region results in suppression of threshold voltage roll-off.

Still further, according to the method of the present invention, ion implantation for forming the second impurity-injected region is performed after formation of the first insulating film serving as an offset insulating film. As a result, the position for forming the second impurity-injected region in the main surface of the substrate can be easily controlled by the thickness of the first insulating film.

Yet further, even after formation of the second impurity-injected region, the upper surface of the first impurity-injected region in part keeps contact with the bottom surface of the sidewall. As a result, it is allowed to avoid concentration of high electric field only under the gate structure.

According to a third aspect of the present invention, the method of manufacturing a semiconductor device includes the following steps (a) through (d) and (x) through (z). The step (a) prepares a substrate. The step (b) provides a gate structure on a main surface of the substrate. The step (x) implants a first impurity of a first conductivity type into the main surface of the substrate using the gate structure serving as a mask against implantation, thereby forming a first impurity-injected region having a first depth and a first concentration. The step (c) provides a first insulating film on a structure obtained by the step (x). The first insulating film has a first portion defined on a side surface of the gate structure. The step (y) implants a second impurity of the first conductivity type into the main surface of the substrate using the gate structure and the first portion each serving as a mask against implantation, thereby forming a second impurity-injected region having a second depth and a second concentration. The second depth is shallower than the first depth and the second concentration is higher than the first concentration. The step (d) provides a second insulating film on a structure obtained by the step (y). The second insulating film has a second portion defined on a side surface of the first portion. Following the step (d), the step (z) implants a third impurity of the first conductivity type into the main surface of the substrate using the gate structure, the first portion and the second portion each serving as a mask against implantation, thereby forming a third impurity-injected region having a third depth and a third concentration. The third depth is greater than the first depth and the third concentration is higher than the second concentration. The second impurity-injected region does not overlap the gate structure in plan view in the step (y).

The second impurity-injected region higher than the first impurity-injected region in concentration is provided under the sidewall (the first and second portions). Therefore, as compared with a semiconductor device having no second impurity-injected region, a contact area between the first impurity-injected region of high electric field and the sidewall is reduced. As a result, the number of hot carriers getting into the lower part of the sidewall from the first impurity-injected region can be reduced, thereby allowing compensation for degradation of lifetime caused by current reduction. Further, the second impurity-injected region shallower in depth than the first impurity-injected region results in suppression of threshold voltage roll-off.

Still further, according to the method of the present invention, ion implantation for forming the second impurity-injected region is performed after formation of the first insulating film serving as an offset insulating film. As a result, the position for forming the second impurity-injected region in the main surface of the substrate can be easily controlled by the thickness of the first insulating film.

Yet further, according to the method of the present invention, the step (z) of forming the third impurity-injected region follows the step (d) of forming the second insulating film. As a result, the method according to the third aspect can save the etching step (e) of forming the sidewall that is required in the method according to the second aspect.

Still further, even after formation of the second impurity-injected region, the upper surface of the first impurity-injected region in part keeps contact with the bottom surface of the sidewall. As a result, it is allowed to avoid concentration of high electric field only under the gate structure.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
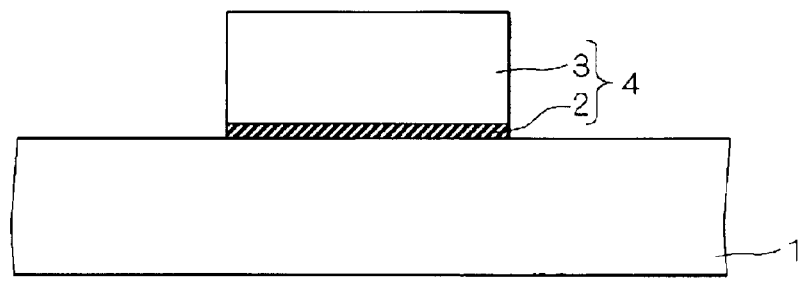
FIGS. 1 through 5 are sectional views illustrating a method of manufacturing a semiconductor device according to a first preferred embodiment of the present invention following the sequence of its steps.

FIGS. 1 through 5 are sectional views illustrating the method of manufacturing a semiconductor device according to the first preferred embodiment of the present invention. First, with reference to FIG. 1, a p-type silicon substrate 1 is prepared. A silicon oxide film is thereafter provided by thermal oxidation on the entire upper surface of the silicon substrate 1 to have a thickness of about 5 nm. Next, a polysilicon film is provided on the entire surface of the silicon oxide film by CVD. The silicon oxide film and the polysilicon film are then pattered using photolithography and anisotropic dry etching, thereby forming a gate structure 4 including a gate insulating film 2 and a gate electrode 3. According to the illustrative example in FIG. 1, the gate electrode 3 includes polysilicon. The gate electrode may have alternative structure including a polysilicon film having a thickness of about 70 nm, a tungsten silicide film of about 70 nm in thickness and a silicon nitride film of about 100 nm in thickness stacked in this order.

Next, with reference to FIG. 2, using ion implantation in a direction tilted a few degrees relative to a direction normal to the upper surface of the silicon substrate 1 allowing avoidance of channeling (such implantation will be hereinafter referred to as "vertical implantation" in the present specification and claims), phosphorous ions 5 are implanted into the upper surface of the silicon substrate 1 under the conditions of 25 keV acceleration energy and 5E13 cm$^{-2}$ dose. At this time, the gate structure 4 serves as a mask against ion implantation. Further, acceleration energy of 25 keV results in a range Rp of 31 nm.

Thereafter annealing is performed for about 20–30 seconds at a temperature of 800–950° C., inducing thermal diffusion of the phosphorous ions 5 in the silicon substrate 1. LDD regions 6 forming a pair are thereby provided in the upper surface of the silicon substrate 1. The annealing for forming the LDD regions 6 should not be necessarily performed in an independent step but alternatively, may be performed simultaneously with annealing for forming MDD regions 9 to be described later.

Figure 2:
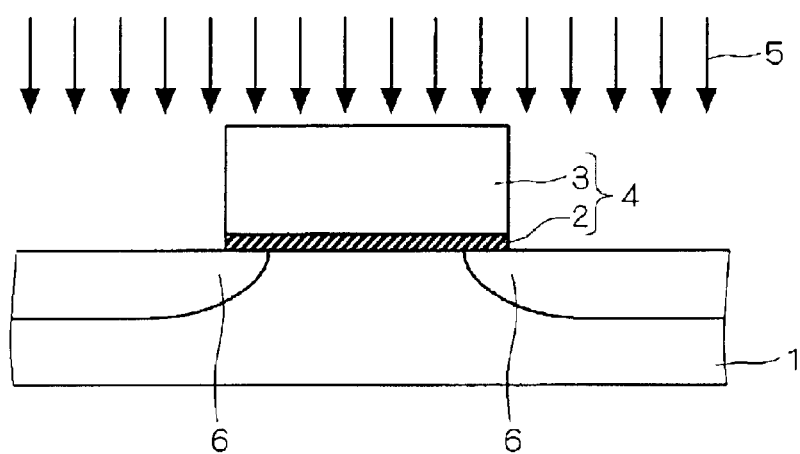
Figure 3:
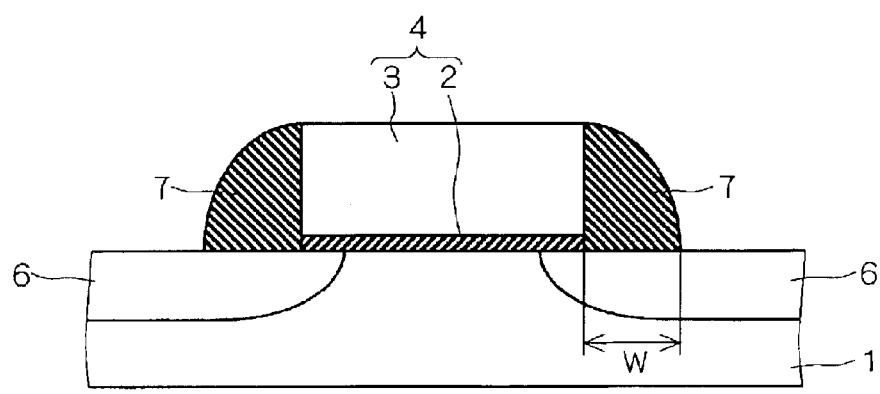

Next, with reference to FIG. 3, using CVD, a silicon nitride film is entirely provided on the structure gained in FIG. 2 to have a thickness of about 60 nm. This silicon nitride film is then etched by anisotropic dry etching, thereby forming sidewalls 7 on the side surfaces of the gate structure 4. For the purpose of suppressing short channel effect, a width W of each sidewall 7 is defined to have a value beyond the proper range as given in the description of the background art (namely, the range of sidewall width allowing both the lifetime K1 defined by current reduction and the lifetime K2 defined by Vth shift to have the certain reference value k or more).

Figure 4:
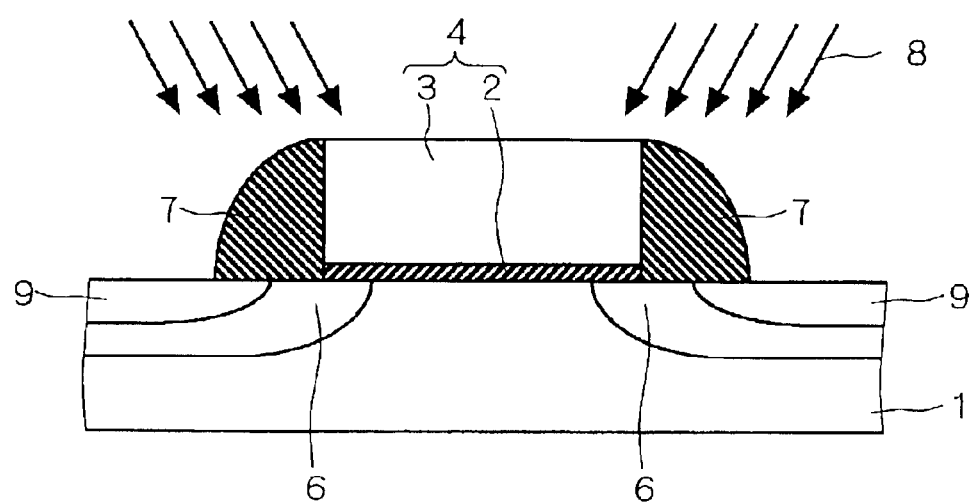

With reference to FIG. 4, rotating the silicon substrate 1, the subsequent step is ion implantation implanting arsenic ions 8 into the upper surface of the silicon substrate 1 in a direction tilted approximately 30 degrees relative to the direction normal to the upper surface of the silicon substrate 1 (such implantation will be hereinafter referred to as "tilted implantation" in the present specification and claims) under the conditions of 20 keV and 2E14 cm$^{-2}$. At this time, the gate structure 4 and the sidewalls 7 each serve as a mask against ion implantation. Further, acceleration energy of 20 keV results in the range Rp of about 16 nm. In view of the implantation tilted approximately 30 degrees, however, the range Rp will be about 14 nm (16 nm×cos 30°) in a projection with respect to a depth direction of the silicon substrate 1.

The next step is annealing for about 20–30 seconds at a temperature of 850–1000° C., inducing thermal diffusion of the arsenic ions 8 in the silicon substrate 1. The MDD regions 9 forming a pair are thereby provided in the upper surface of the silicon substrate 1. The annealing for forming the MDD regions 9 should not be necessarily performed in an independent step but alternatively, may be performed simultaneously with annealing for forming source/drain regions 11 to be described later. In the present specification and claims, "MDD (medium doped drain) region" designates an impurity-injected region having a concentration level lying halfway between those of an LDD region of a relatively low concentration and of a source/drain region of relatively high concentration.

Figure 5:
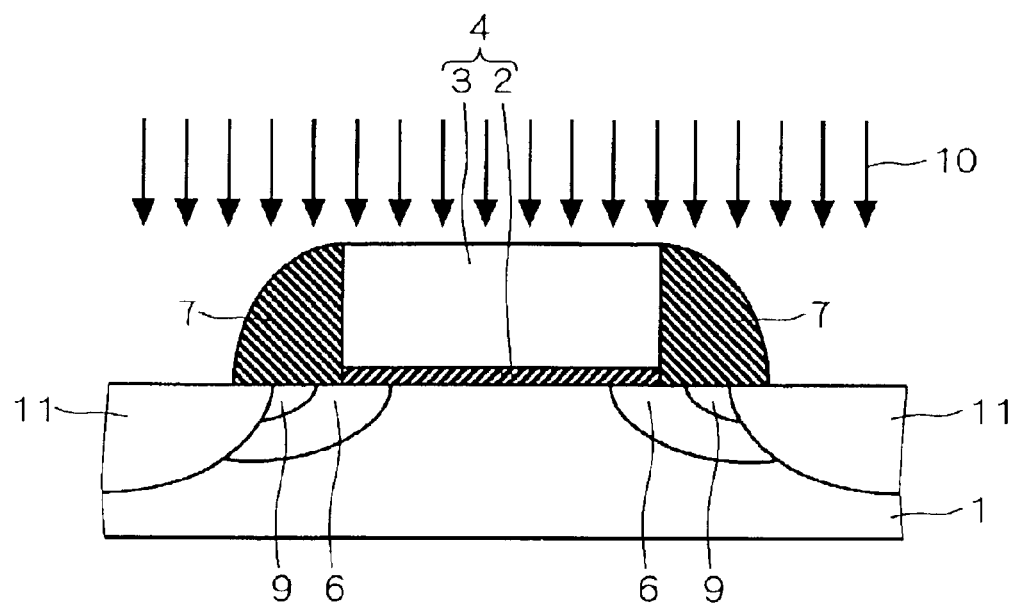

With reference to FIG. 5, arsenic ions 10 are thereafter implanted into the upper surface of the silicon substrate 1 by the vertical implantation under the conditions of 60 keV and 5E15 cm$^{-2}$. At this time, the gate structure 4 and the sidewalls 7 each serve as a mask against ion implantation. Next, annealing is performed for about 20–30 seconds at a temperature of 950–1000° C., inducing thermal diffusion of the arsenic ions 10 in the silicon substrate 1. The source/drain regions 11 forming a pair are thereby provided in the upper surface of the silicon substrate 1.

Figure 6:
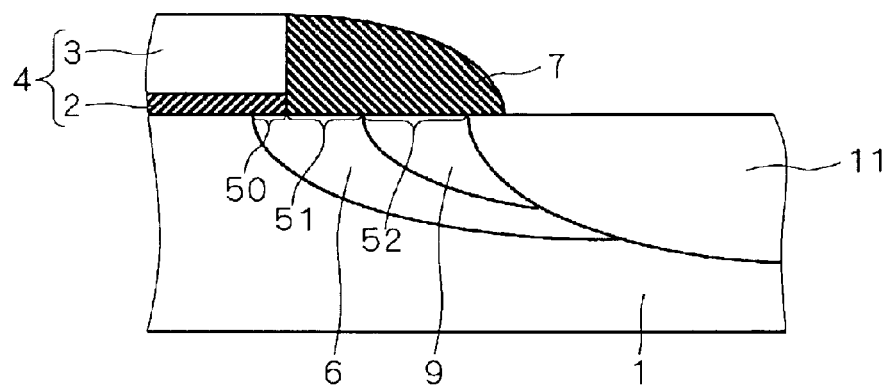
FIG. 6 is sectional view illustrating drain and its vicinity of the structure obtained in FIG. 5 in an enlarged manner.

FIG. 6 is a sectional view illustrating drain and its vicinity of the structure obtained in FIG. 5 in an enlarged manner. The LDD region 6 has a concentration on the order of $10^{18}$ cm$^{-3}$, the MDD region 9 of $10^{19}$ cm$^{-3}$ and the source/drain region 11 of $10^{20}$ cm$^{-3}$. The MDD region 9 is formed into a depth shallower than that of the LDD region 6. Further, the source/drain region 11 is formed into a depth greater than that of the LDD region 6.

The LDD region 6 has an upper surface 50 contacting the bottom surface of the gate insulating film 2 and an upper surface 51 contacting the bottom surface of the sidewall 7. When looked down on from the gate structure 4, the gate structure 4 and the upper surface 50 of the LDD region 6 overlap one another. Namely, the end of the LDD region 6 on the side of the gate structure 4 and the gate structure 4 overlap one another in plan view.

The MDD region 9 has an upper surface 52 contacting the bottom surface of the sidewall 7. Due to the existence of the upper surface 51 of the LDD region 6, the upper surface 52 of the MDD region 9 has no contact with the bottom surface of the gate insulating film 2. Namely, the MDD region 9 does not extend under the gate structure 4 and therefore, does not overlap the gate structure 4 in plan view.

As described above, in the method of manufacturing a semiconductor device according to the first preferred embodiment, the MDD region 9 higher than the LDD region 6 in concentration is provided under the sidewall 7. Therefore, as compared with the semiconductor device having no MDD region 9 manufactured by the background-art method, the first preferred embodiment allows reduction in contact area between the LDD region 6 of high electric field and the sidewall 7. As a result, the number of hot carriers getting into the lower part of the sidewall 7 from the LDD region 6 can be reduced, thereby allowing in compensation for degradation of lifetime caused by current reduction.

Further, the MDD region 9 is shallower in depth than the LDD region 6. Therefore, a phenomenon in which threshold voltage Vth of an MOSFET reduces accompanied by decrease in channel length (roll-off) can be suppressed for the following reason. The threshold voltage roll-off becomes more noticeable as the impurity-injected region lower in concentration than the source/drain region 11 (LDD and MDD regions 6 and 9) increases in depth. On the contrary, the structure requiring the MDD region 9 to be formed into a depth shallower than that of the LDD region 6 results in prevention of remarkable growth of the roll-off that is to be caused by the deeply-formed MDD region 9.

Figure 7:
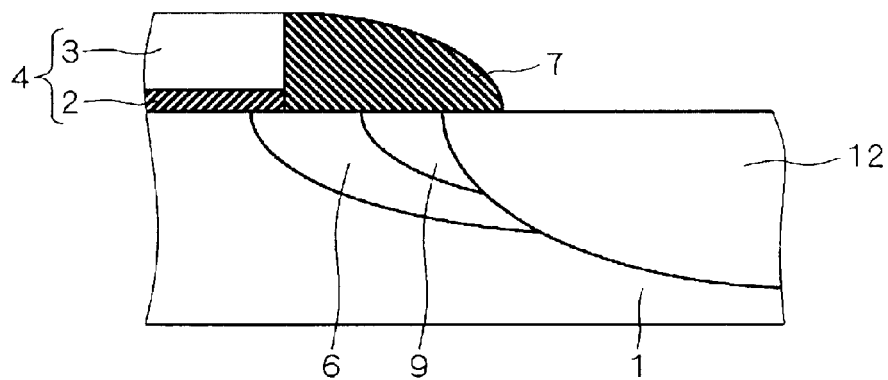
FIG. 7 is a sectional view illustrating drain and its vicinity of a semiconductor device in an enlarged manner that is manufactured following a method according to a modification of the first preferred embodiment of the present invention.

FIG. 7 is a sectional view illustrating drain and its vicinity of a semiconductor device in an enlarged manner that is manufactured following a method according to the modification of the first preferred embodiment of the present invention. While illustrative example in FIG. 5 requires implantation with the arsenic ions 10, the method according to the modification of the first preferred embodiment requires implantation with phosphorous ions instead. The other requirements including the steps and conditions are the same as those in the above-described method according to the first preferred embodiment.

Phosphorous is higher than arsenic in coefficient of thermal diffusion. Comparing FIGS. 6 and 7, it is seen accordingly that the source/drain region 12 covers more widely-spread area than the source/drain region 11. It is further seen that a depletion layer generated at a pn junction between the source/drain region 12 and the silicon substrate 1 covers more widely-spread area than a depletion layer at a pn junction between the source/drain region 11 and the silicon substrate 1. As a result, electric field generated between the drain and the silicon substrate 1 is relaxed, thereby allowing reduction in junction leakage current. Implantation with phosphorous ions introduced in the modification of the first preferred embodiment is further applicable to the method of manufacturing a semiconductor device according to the second and third preferred embodiments to be described later.

In the description given above, an NMOSFET including n-type impurities implanted therein is the exemplary semiconductor device to be manufactured according to the method of the first preferred embodiment of the present invention. The method according to the first preferred embodiment is alternatively applicable to a PMOSFET including p-type impurities implanted therein. Still alternatively, it is also applicable to a CMOSFET holding an NMOSFET an a PMOSFET formed in one semiconductor substrate. These alternatives should hold true in the second and third preferred embodiments to be described below. When the first preferred embodiment is applied in manufacturing a CMOSFET, it requires no emphasis that n-type impurities and p-type impurities should be separately implanted using a photoresist as a mask against implantation.

Second Preferred Embodiment

Figure 8:
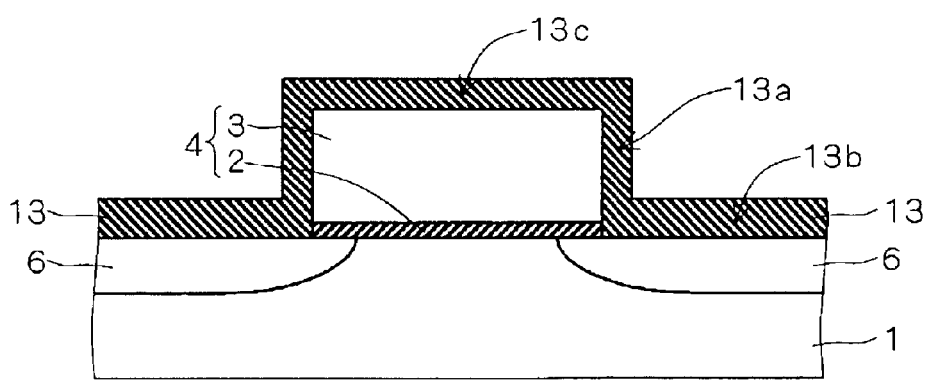
FIGS. 8 through 12 are sectional views illustrating a method of manufacturing a semiconductor device according to a second preferred embodiment of the present invention following the sequence of its steps.

FIGS. 8 through 12 are sectional views illustrating the method of manufacturing a semiconductor device according to the second preferred embodiment of the present invention following the sequence of its steps. With reference to FIG. 8, after the structure shown in FIG. 1 is given following the same steps as in the first preferred embodiment, arsenic ions are implanted into the upper surface of the silicon substrate 1 by the vertical implantation under the conditions of 30 keV and 5E13 cm$^{-2}$. Arsenic ions may be substituted by phosphorous ions. Next, annealing is performed for about 20–30 seconds at a temperature of 800–950° C., thereby providing the LDD regions 6 forming a pair in the upper surface of the silicon substrate 1. The annealing for forming the LDD regions 6 should not be necessarily performed in an independent step but alternatively, may be performed simultaneously with annealing for forming MDD regions 15 to be described later.

In the subsequent step, a silicon nitride film 13 is entirely provided by CVD to have a thickness of about 30 nm. The silicon nitride film 13 includes a portion 13a defined on the side surface of the gate structure 4, a portion 13b on the upper surface of the silicon substrate 1 and a portion 13c on the gate structure 4. The silicon nitride film 13 serves as an offset insulating film for defining position for forming the below-described MDD regions 15. For serving as an offset insulating film, the silicon nitride film 13 is required to include at least the portion 13a. The portions 13b and 13c are not necessarily required.

Figure 9:
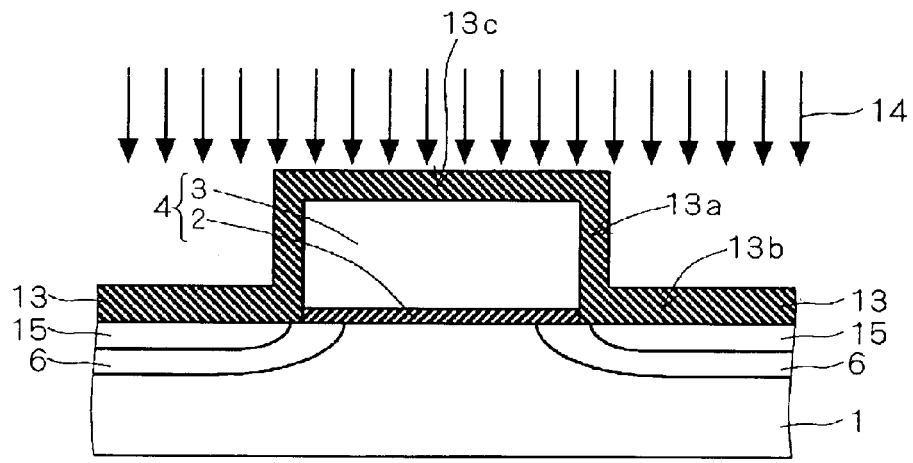

Next, with reference to FIG. 9, arsenic ions 14 are implanted into the upper surface of the silicon substrate 1 penetrating the portion 13b of the silicon nitride film 13 by the vertical implantation under the conditions of 60 keV and 2E14 cm$^{-2}$. At this time, the gate structure 4 and the portions 13a, 13c of the silicon nitride film 13 each serve as a mask against implantation. The subsequent step is annealing for about 20–30 seconds at a temperature of 850–1000° C., inducing thermal diffusion of the arsenic ions 14 in the silicon substrate 1. The MDD regions 15 for forming a pair are thereby provided in the upper surface of the silicon substrate 1. The annealing for forming the MDD regions 15 should not be necessarily performed in an independent step but alternatively, may be performed simultaneously with annealing for forming below-described source/drain regions 19. The MDD regions 15 are each higher by one order of magnitude in concentration than the LDD region 6. Further, the MDD region 15 is formed into a depth shallower than that of the LDD region 6.

As described above, the portion 13a of the silicon nitride film 13 serves as a mask during implantation with the arsenic ions 14. Therefore, the MDD region 15 is offset away from a channel region by a distance approximately the same as the thickness of the portion 13a (defined to be 30 nm in the illustrative example). As a result, similar to the first preferred embodiment, the MDD region 15 and the gate structure 4 do not overlap one another in plan view.

After formation of the silicon nitride film 13 and prior to ion implantation for forming the MDD region 15, p-type impurities may be implanted into a depth somewhat deeper than the intended depth for the MDD region 15. A p-type pocket region is formed accordingly in the silicon substrate 1, thereby avoiding spread of the MDD region 15 in the depth direction of the silicon substrate 1 and suppressing short channel effect such as roll-off to a greater degree.

Figure 10:
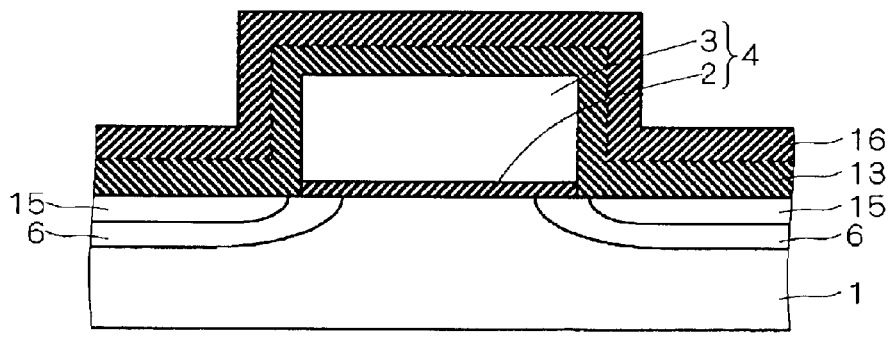
Figure 11:
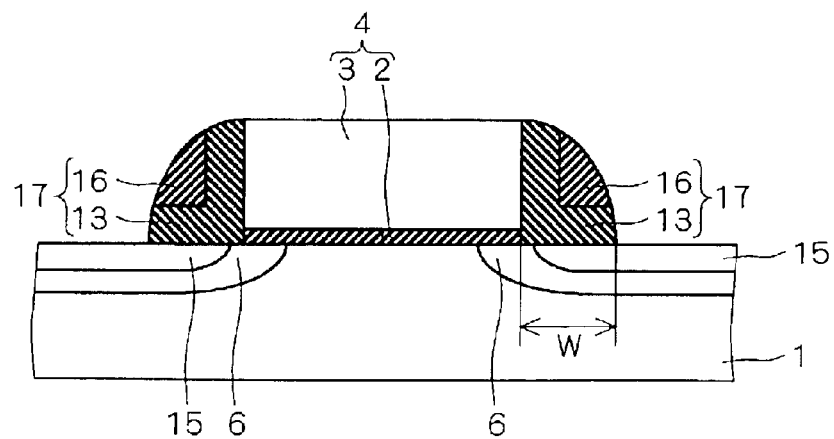

The next step in FIG. 10 is CVD for entirely providing a silicon nitride film 16 to have a thickness of about 40 nm, which is followed by anisotropic dry etching of the silicon nitride films 13 and 16. Sidewalls 17 are thereby formed on the side surfaces of the gate structure 4 as illustrated in FIG. 11. For the purpose of suppressing short channel effect, a width W of each sidewall 17 is defined to have a value beyond the proper range as given in the description of the background art.

Figure 12:
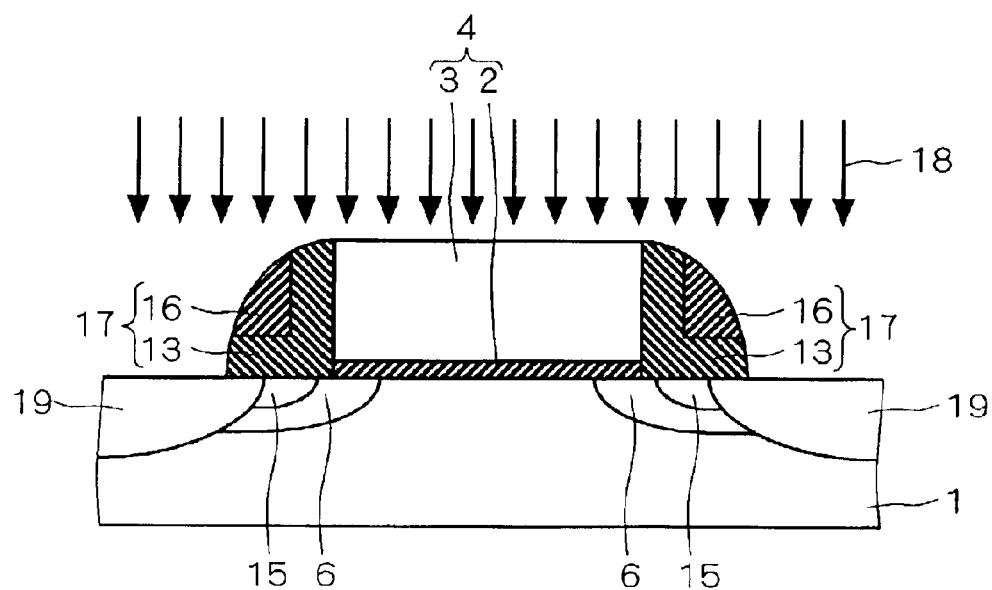

With reference to FIG. 12, the subsequent step is the vertical implantation implanting arsenic ions 18 into the upper surface of the silicon substrate 1 under the conditions of 60 keV and 5E15 cm$^{-2}$. At this time, the gate structure 4 and the sidewalls 17 each serve as a mask against implantation. Thereafter annealing is performed for about 20–30 seconds at a temperature of 950–1000° C., inducing thermal diffusion of the arsenic ions 18 in the silicon substrate 1. The source/drain regions 19 forming a pair are thereby provided in the upper surface of the silicon substrate 1. The source/drain regions 19 are each higher by one order of magnitude in concentration than the MDD region 15. Further, the source/drain region 19 is formed into a depth greater than that of the LDD region 6.

In addition to the foregoing effects gained by the method according to the first preferred embodiment, the method according to the second preferred embodiment achieves the following effect. That is, the ion implantation for forming the MDD region 15 is performed after formation of the silicon nitride film 13 serving as an offset insulating film. As a result, the position for forming the MDD region 15 in the upper surface of the silicon substrate 1 can be easily controlled by the thickness of the silicon nitride film 13.

Third Preferred Embodiment

Figure 13:
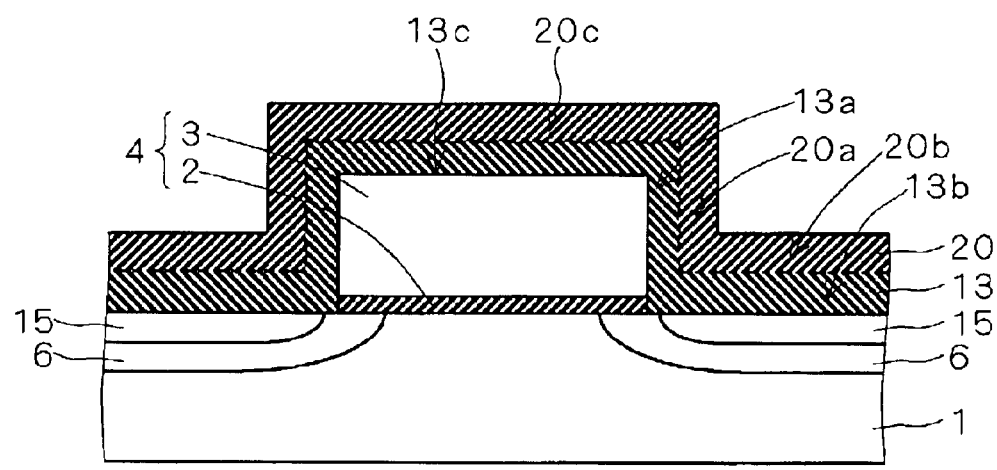
FIGS. 13 and 14 are sectional views illustrating a method of manufacturing a semiconductor device according to a third preferred embodiment of the present invention following the sequence of its steps.
Figure 14:
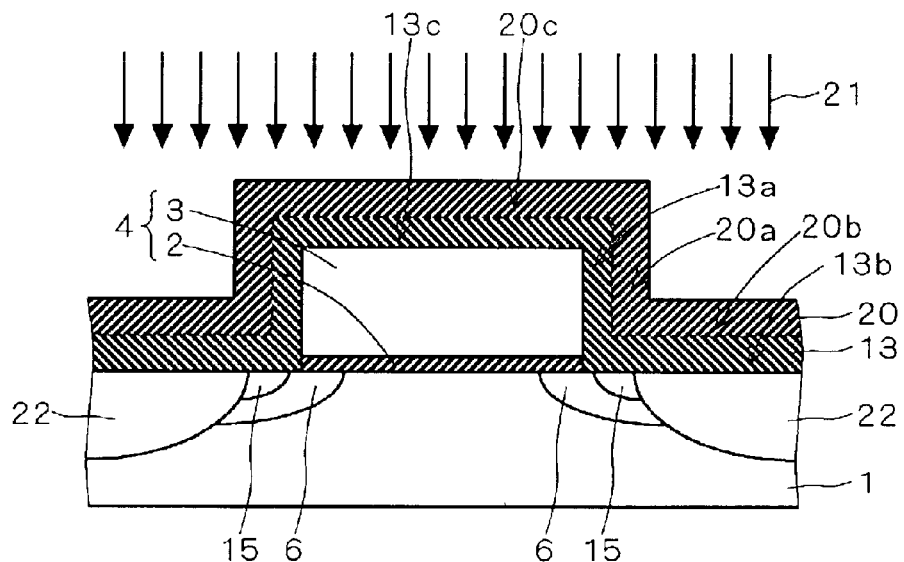
Figure 15:
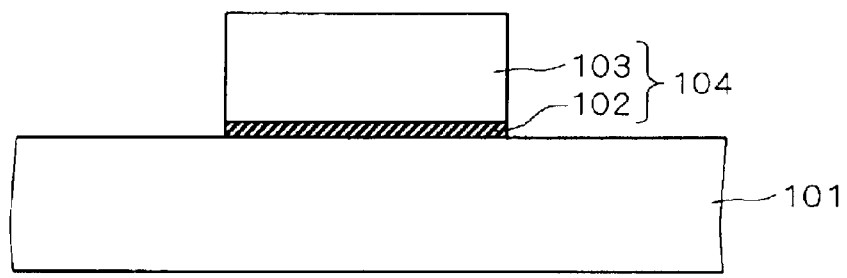
FIGS. 15 through 18 are sectional views illustrating a method of manufacturing a semiconductor device having an LDD structure in the background art following the sequence of its steps.
Figure 16:
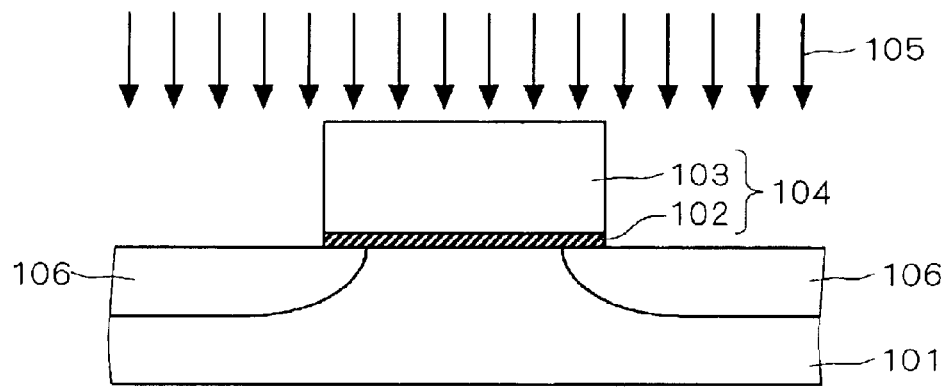
Figure 17:
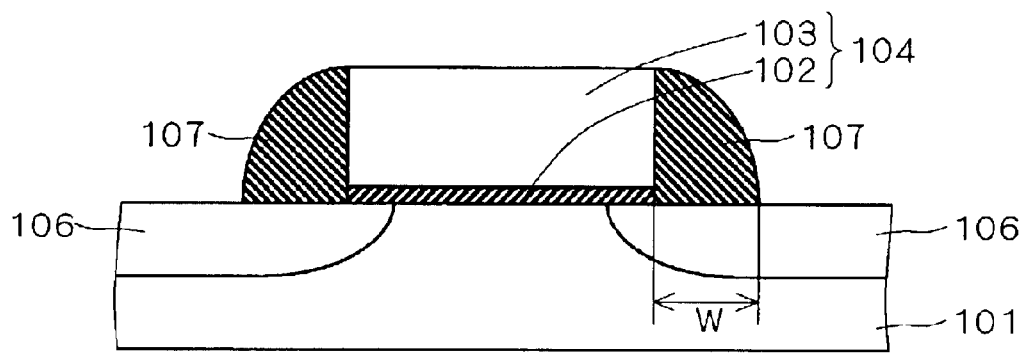
Figure 18:
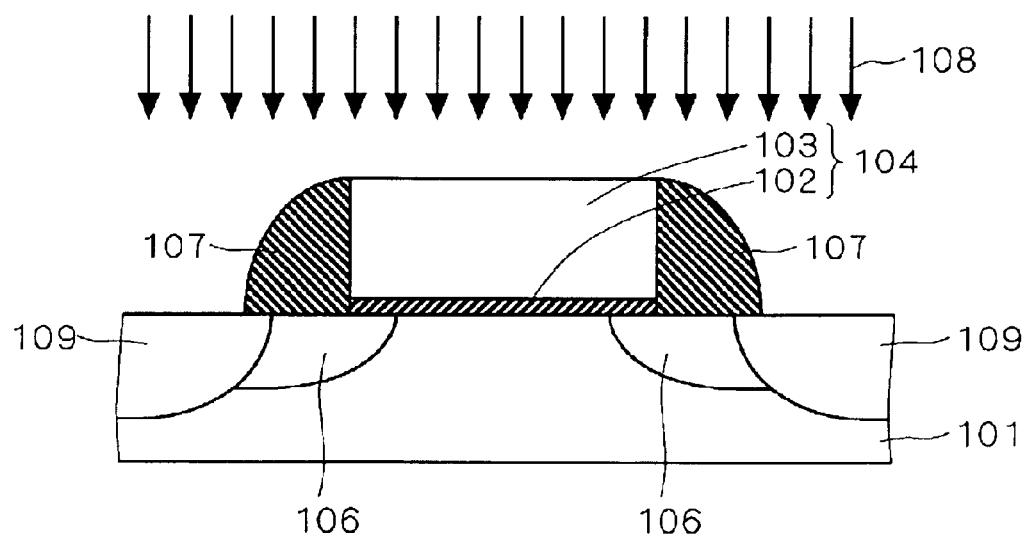
Figure 19:
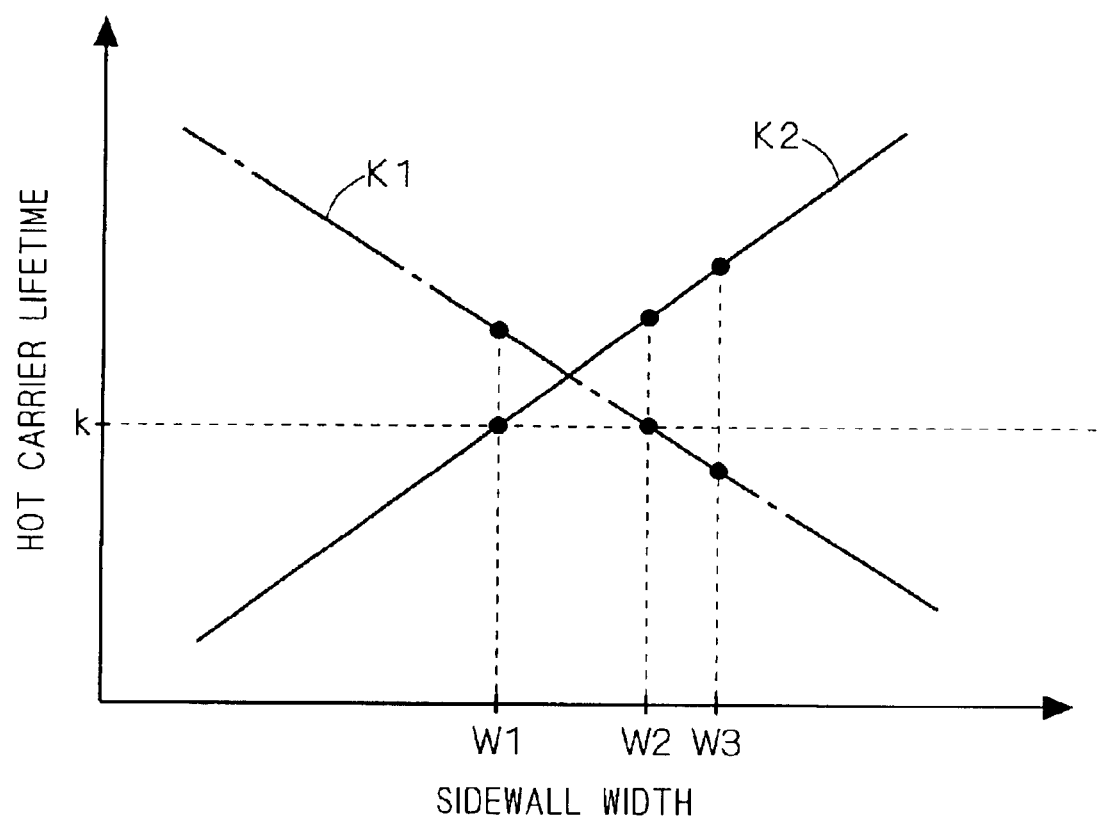
FIG. 19 is a graph showing relation between sidewall width and hot carrier lifetime.

FIGS. 13 and 14 are sectional views illustrating the method of manufacturing a semiconductor device according to the third preferred embodiment of the present invention following the sequence of its steps. With reference to FIG. 13, after the structure shown in FIG. 9 is given following the same steps as in the second preferred embodiment, a silicon nitride film 20 is entirely provided by CVD to have a thickness of about 40 nm. The silicon nitride film 20 includes a portion 20a defined on the side surface of the portion 13a of the silicon nitride film 13, a portion 20b on the portion 13b and a portion 20c on the portion 13c.

With reference to FIG. 14, the step subsequent to FIG. 13 is the vertical implantation implanting arsenic ions 21 into the upper surface of the silicon substrate 1 penetrating the portion 13b of the silicon nitride film 13 and the portion 20b of the silicon nitride film 20 under the conditions of 90 keV and 5E15 cm$^{-2}$. At this time, the gate structure 4, the portions 13a, 13c of the silicon nitride film 13 and the portions 20a, 20c of the silicon nitride film 20 each serve as a mask against implantation. Annealing is thereafter performed for about 20–30 seconds at a temperature of 950–1000° C., inducing thermal diffusion of the arsenic ions 21 in the silicon substrate 1. Source/drain regions 22 forming a pair are thereby provided in the upper surface of the silicon substrate 1. The source/drain regions 22 are each higher by one order of magnitude in concentration than the MDD region 15. Further, the source/drain region 22 is formed into a depth greater than that of the LDD region 6.

In addition to the foregoing effects gained by the methods according to the first and second preferred embodiments, the method according to the third preferred embodiment achieves the following effect. That is, the step of forming the silicon nitride film 20 (FIG. 13) is continuously followed by ion implantation (FIG. 14) for forming the source/drain region 22. Therefore, anisotropic dry etching for forming the sidewall 17 (FIG. 12) can be omitted, thereby resulting in simplification of the manufacturing steps as compared with the method according to the second preferred embodiment.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising the steps of
   (a) preparing a substrate;
   (b) providing a gate structure on a main surface of said substrate;
   (x) implanting a first impurity of a conductivity type into said main surface of said substrate using said gate structure configured to serve as a mask against implantation, thereby forming a first impurity-injected region having a first depth and a first concentration;

(c) after said step (x), providing a sidewall on a side surface of said gate structure;

(y) implanting a second impurity of said conductivity type into said main surface of said substrate including a region defined under said sidewall using said gate structure and said sidewall each configured to serve as a mask against implantation, thereby forming a second impurity-injected region having a second depth and a second concentration, said second depth being shallower than said first depth and said second concentration being higher than said first concentration; and (z) implanting a third impurity of said conductivity type into said main surface of said substrate using said gate structure and said sidewall each configured to serve as a mask against implantation, thereby forming a third impurity-injected region having a third depth and a third concentration, said third depth being greater than said first depth and said third concentration being higher than said second concentration, wherein in said step (y), said second impurity-injected region does not overlap said gate structure in plan view.

2. The method according to claim 1, wherein in said step (y), said second impurity is implanted into said main surface of said substrate by tilted implantation.

3. The method according to claim 1, wherein in said step (x), said first impurity is higher than said second impurity in coefficient of thermal diffusion.

4. The method according to claim 3, wherein in said step (z), said third impurity is higher than said second impurity in coefficient of thermal diffusion.

5. A method of manufacturing a semiconductor device, comprising the steps of (a) preparing a substrate;

(b) providing a gate structure on main surface of said substrate;

(x) implanting a first impurity of a first conductivity type into said main surface of said substrate using said gate structure configured to serve as a mask against implantation, thereby forming a first impurity-injected region having a first depth and a first concentration;

(c) providing a first insulating film on a structure obtained by said step (x), said first insulating film having a first portion defined on a side surface of said gate structure;

(y) implanting a second impurity of said first conductivity type into said main surface of said substrate using said gate structure and said first portion each configured to serve as a mask against implantation, thereby forming a second impurity-injected region having a second depth and a second concentration, said second depth being shallower than said first depth and said second concentration being higher than said first concentration;

(d) providing a second insulating film on a structure obtained by said step (y), said second insulating film having a second portion defined on a side surface of said first portion;

(e) etching said first and second insulating films, thereby forming a sidewall on a side surface of said gate structure; and (z) implanting a third impurity of said first conductivity type into said main surface of said substrate using said gate structure and said sidewall each configured to serve as a mask against implantation, thereby forming a third impurity-injected region having a third depth and a third concentration, said third depth being greater than said first depth and third concentration being higher than said second concentration, wherein in said step (y), said second impurity-injected region does not overlap said gate structure in plan view.

6. The method according to claim 5, wherein in said step (c), said first insulating film has a third portion defined on said main surface of said substrate, and in said step (y), said second impurity is implanted into said main surface of said substrate penetrating said third portion.

7. The method according to claim 5, further comprising the step of:

(m) after said step (c) and prior to said step (y), providing a fourth impurity-injected region at a depth greater than an intended depth for said second impurity-injected region, said fourth impurity-injected region having a second conductivity type different from said first conductivity type.

8. The method according to claim 5, wherein in said step (x), said first impurity is higher than said second impurity in coefficient of thermal diffusion.

9. The method according to claim 8, wherein in said step (z), said third impurity is higher than said second impurity in coefficient of thermal diffusion.

10. A method of manufacturing a semiconductor device, comprising the steps of:

(a) preparing a substrate;

(b) providing a gate structure on a main surface of said substrate;

(x) implanting a first impurity of a first conductivity type into said main surface of said substrate using said gate structure configured to serve as a mask against implantation, thereby forming a first impurity-injected region having a first depth and a first concentration;

(c) providing a first insulating film on a structure obtained by said step (x), said first insulating film having a first portion defined on a side surface of said gate structure;

(y) implanting a second impurity of said first conductivity type into said main surface of said substrate using said gate structure and said first portion each configured to serve as a mask against implantation, thereby forming a second impurity-injected region having a second depth and a second concentration, said second depth being shallower than said first depth and said second concentration being higher than said first concentration;

(d) providing a second insulating film on a structure obtained by said step (y), said second insulating film having a second portion defined on a side surface of said first portion; and (z) following said step (d), implanting a third impurity of said first conductivity type into said main surface of said substrate using said gate structure, said first portion and said second portion each configured to serve as a mask against implantation, thereby forming a third impurity-injected region having a third depth and a third concentration, said third depth being greater than said first depth and said third concentration being higher than said second concentration, wherein in said step (y), said second impurity-injected region does not overlap said gate structure in plan view.

11. The method according to claim 10, wherein in said step (c), said first insulating film has a third portion defined on said main surface of said substrate, and in said step (y), said second impurity is implanted into said main surface of said substrate penetrating said third portion.

12. The method according to claim 10, further comprising the step of:
   (m) after said step (c) and prior to said step (y), providing a fourth impurity-injected region at a depth greater than an intended depth for said second impurity-injected region, said fourth impurity-injected region having a second conductivity type different from said first conductivity type.

13. The method according to claim 10, wherein
   in said step (c), said first insulating film has a third portion defined on said main surface of said substrate,
   in said step (d), said second insulating film has a fourth portion defined on said third portion, and
   in said step (z), said third impurity is implanted into said main surface of said substrate penetrating said third and fourth portions.

14. The method according to claim 10, wherein
   in said step (x), said first impurity is higher than said second impurity in coefficient of thermal diffusion.

15. The method according to claim 14, wherein
   in said step (z), said third impurity is higher than said second impurity in coefficient of thermal diffusion.

* * * * *